(12) United States Patent
Lin et al.

(10) Patent No.: US 7,749,814 B2
(45) Date of Patent: Jul. 6, 2010

(54) SEMICONDUCTOR DEVICE WITH INTEGRATED PASSIVE CIRCUIT AND METHOD OF MAKING THE SAME USING SACRIFICIAL SUBSTRATE

(75) Inventors: Yaojian Lin, Singapore (SG); Haijing Cao, Singapore (SG); Kang Chen, Singapore (SG); Qing Zhang, Singapore (SG); Jianmin Fang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 295 days.

(21) Appl. No.: 12/047,640

(22) Filed: Mar. 13, 2008

(65) Prior Publication Data

US 2009/0230542 A1 Sep. 17, 2009

(51) Int. Cl.
*H01L 21/00* (2006.01)

(52) U.S. Cl. ............... 438/125; 438/127; 438/598; 257/700; 257/E21.924; 257/E23.168

(58) Field of Classification Search ............ 438/125, 438/127, 598; 257/700, E21.294, E23.168
See application file for complete search history.

(56) References Cited

U.S. PATENT DOCUMENTS 5,514,613 A * 5/1996 Santadrea et al. ......... 438/15

| | | | |
|---|---|---|---|
| 6,495,912 B1 | 12/2002 | Huang et al. | |
| 2004/0147064 A1* | 7/2004 | He | 438/127 |
| 2005/0253255 A1 | 11/2005 | Degani et al. | |
| 2007/0114634 A1 | 5/2007 | Lin et al. | |

* cited by examiner

Primary Examiner—Fernando L Toledo
(74) Attorney, Agent, or Firm—Robert D. Atkins

(57) ABSTRACT

A semiconductor device is made by providing a sacrificial substrate, forming a first insulating layer over the sacrificial substrate, forming a first passivation layer over the first insulating layer, forming a second insulating layer over the first passivation layer, forming an integrated passive device over the second insulating layer, forming a wafer support structure over the integrated passive device, removing the sacrificial substrate to expose the first insulating layer after forming the wafer support structure, and forming an interconnect structure over the first insulating layer in electrical contact with the integrated passive device. The integrated passive device includes an inductor, capacitor, or resistor. The sacrificial substrate is removed by mechanical grinding and wet etching. The wafer support structure can be glass, ceramic, silicon, or molding compound. The interconnect structure can include a solder bump, wire bond, and intermediate conduction layer formed on a backside of the semiconductor device.

25 Claims, 6 Drawing Sheets

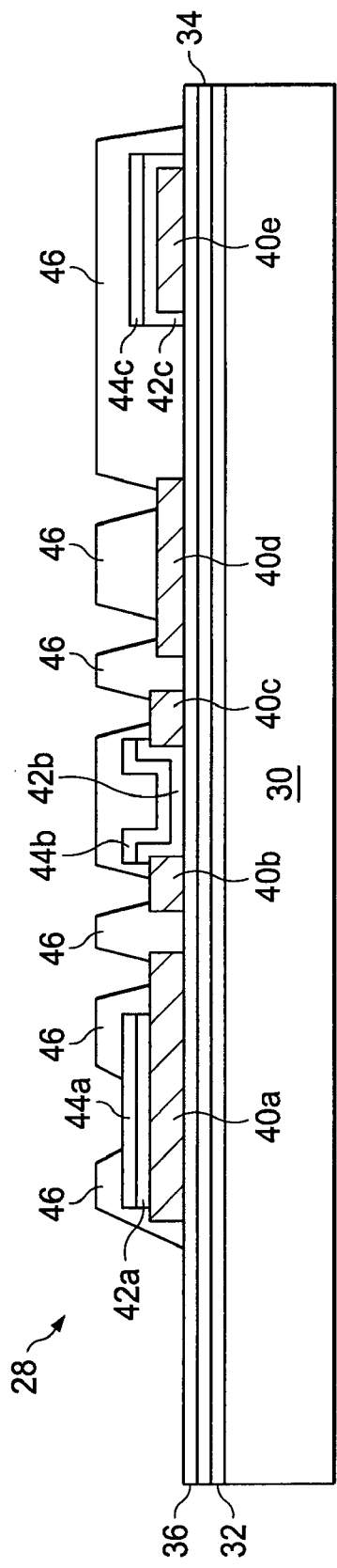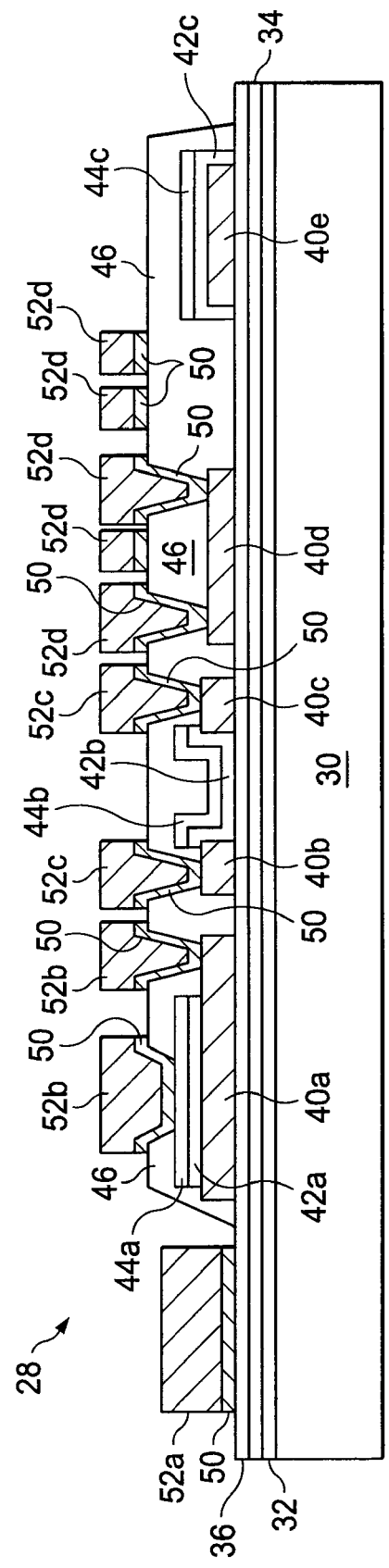

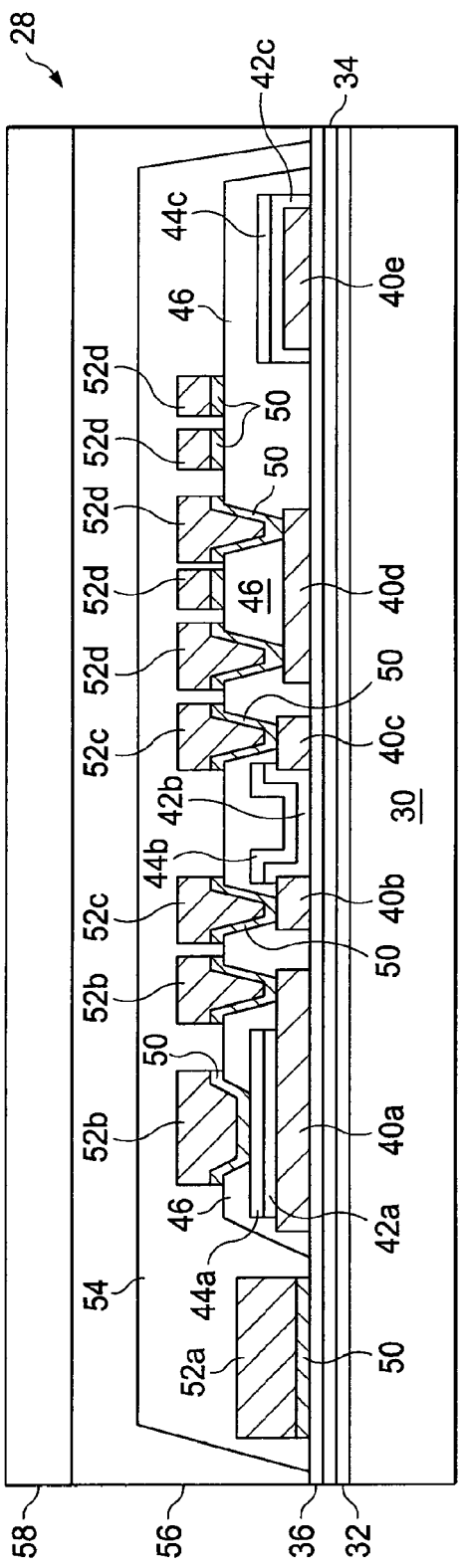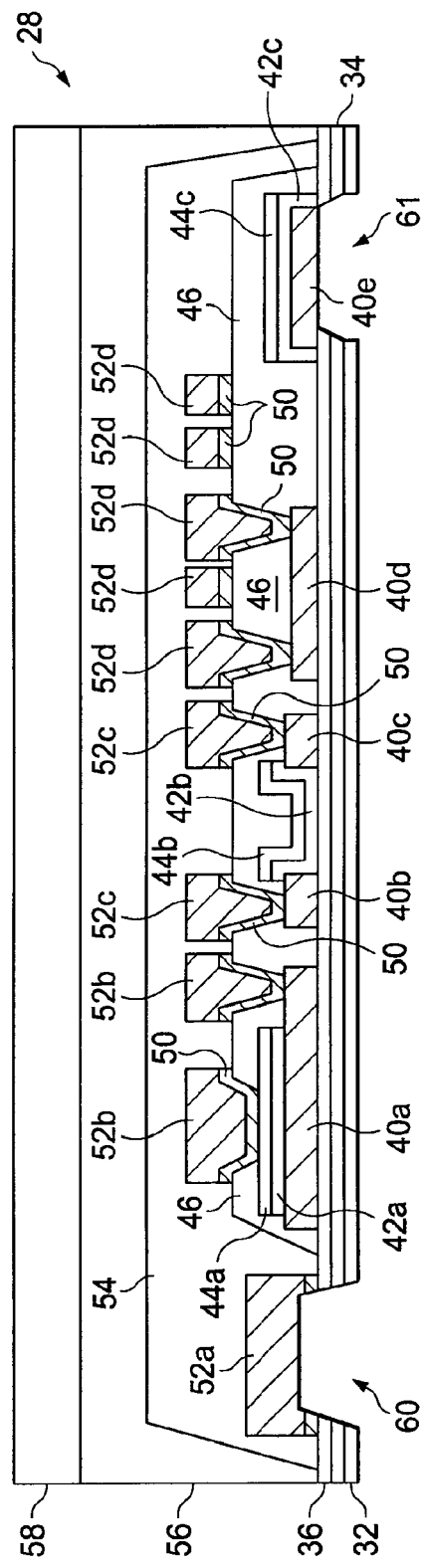

SEMICONDUCTOR DEVICE WITH INTEGRATED PASSIVE CIRCUIT AND METHOD OF MAKING THE SAME USING SACRIFICIAL SUBSTRATE

FIELD OF THE INVENTION

The present invention relates in general to semiconductor devices and, more particularly, to a semiconductor device having an integrated passive circuit and method of making the same using a sacrificial substrate.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to form passive circuit elements, e.g., inductors, capacitors, and resistors, on the semiconductor die. The integrated passive devices (IPD) are typically formed on highly resistive silicon wafers. The silicon wafers have high manufacturing costs and a form factor that limits IPD design layouts.

A need exists to form IPDs without the disadvantages of using high-cost silicon wafers.

SUMMARY OF THE INVENTION

In one embodiment, the present invention is a method of making a semiconductor device comprising the steps of providing a sacrificial substrate, forming a first insulating layer over the sacrificial substrate, forming a first passivation layer over the first insulating layer, forming a second insulating layer over the first passivation layer, forming an integrated passive device over the second insulating layer, forming a wafer support structure over the integrated passive device, removing the sacrificial substrate to expose the first insulating layer after forming the wafer support structure, and forming an interconnect structure over the first insulating layer in electrical contact with the integrated passive device.

In another embodiment, the present invention is a method of making a semiconductor wafer comprising the steps of providing a sacrificial substrate, forming a buffer layer over the sacrificial substrate, forming an integrated passive device over the buffer layer, forming a wafer support structure over the integrated passive device, removing the sacrificial substrate to expose the buffer layer after forming the wafer support structure, and forming an interconnect structure over the buffer layer in electrical contact with the integrated passive device.

In another embodiment, the present invention is a method of making a semiconductor wafer comprising the steps of providing a sacrificial substrate, forming a buffer layer over the sacrificial substrate, forming a semiconductor device over the buffer layer, forming a wafer support structure over the semiconductor device, removing the sacrificial substrate to expose the buffer layer after forming the wafer support structure, and forming an interconnect structure over the buffer layer in electrical contact with the semiconductor device.

In another embodiment, the present invention is a semiconductor device made by a process comprising the steps of providing a sacrificial substrate, forming a buffer layer over the sacrificial substrate, forming an integrated passive device over the buffer layer, forming a wafer support structure over the integrated passive device, removing the sacrificial substrate to expose the buffer layer after forming the wafer support structure, and forming an interconnect structure over the buffer layer in electrical contact with the integrated passive device.

BRIEF DESCRIPTION OF THE DRAWINGS

FIGS. 2a-2f illustrate a process of forming a semiconductor device with integrated passive devices using a sacrificial substrate;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
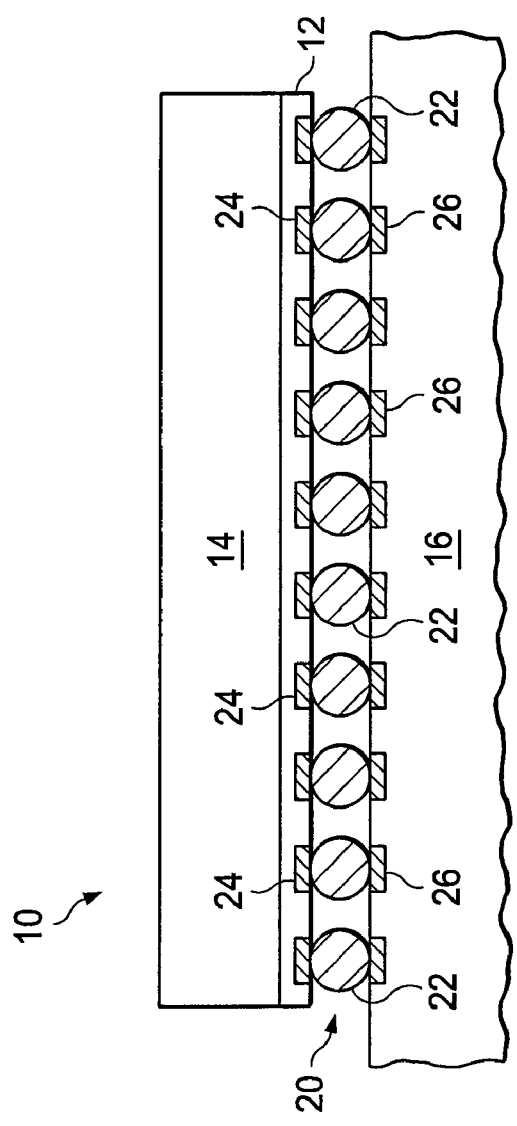
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive devices formed within active area 12 and may be electrically interconnected. For example, an analog circuit may include one or more inductor, capacitor and resistor formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Figure 2A:
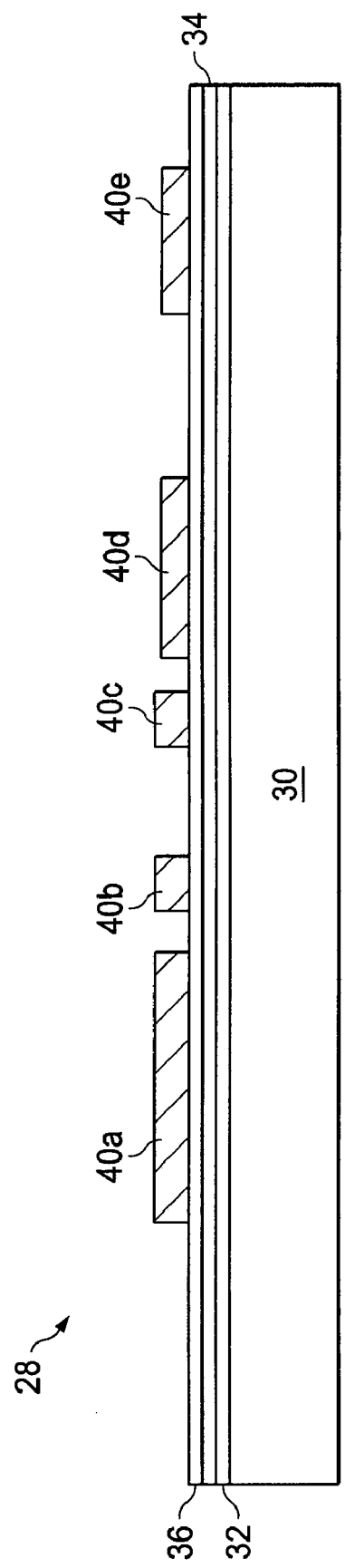

FIGS. 2a-2f illustrate a process of forming a semiconductor device including integrated passive circuit devices (IPD) on semiconductor wafer 28. In FIG. 2a, a low cost dummy or sacrificial substrate 30 is shown. Substrate 30 can be made with silicon (Si), ceramic, or glass. An optional insulating layer 32 is formed on substrate 30. The insulating layer 32 provides stress relief for passivation layer 34 and, together with passivation layer 34, operates as an etch stop. The insulating layer 32 is typically made with silicon dioxide (SiO2), but can also be made with silicon nitride (SixNy), silicon oxynitride (SiON), tantalum pentoxide (Ta2O5), zircon (ZrO2), aluminum oxide (Al2O3), or other material having dielectric insulation properties. The deposition of insulating layer 32 may involve physical vapor deposition (PVD), chemical vapor deposition (CVD), printing, and sintering or thermal oxidation and result in a thickness ranging from 100-5000 Å.

A passivation layer 34 is formed over insulating layer 32 for structural support and physical and electrical isolation, and acts as an etching stop layer during etching and removal of dummy substrate 30. Passivation layer 34 can be made with one or more layers of SixNy, Si3N4, SiN, SiO2, SiON, polyimide (PI), benzocyclobutene (BCB), polybenzoxazole (PBO), or other insulating material. Passivation layer 34 has a thickness of 500 Å to 30 µm. The layer stack 32-34 may be removed during removing dummy substrate by the etching method—wet etching, dry etching or CMP polishing.

An insulating layer 36 is formed on passivation layer 34. The insulating layer 36 is made with SixNy, SiO2, SiON, Ta2O5, ZrO2, Al2O3, or other material having dielectric insulation properties. The deposition of insulating layer 36 may involve PVD, CVD, printing, and sintering with a thickness ranging from 1000-5000 Å. The combination of insulating layers 32 and 36 and passivation layer 34 constitute a buffer layer or passivation sandwich between the backside interconnect structure and passive and active circuits formed on the semiconductor device.

An electrically conductive layer 40 is formed on insulating layer 36 using a patterning and deposition process. Conductive layer 40 has individual portions or sections 40a-40e. The individual portions of conductive layers 40a-40e can be electrically common or electrically isolated depending on the connectivity of the individual semiconductor die formed on wafer 28. Conductive layer 40 can be made with aluminum (Al), aluminum alloy, copper (Cu), tin (Sn), nickel (Ni), gold (Au), silver (Ag), or other electrically conductive material. Conductive layer 40 can have optional adhesion and barrier layers formed underneath or over the conductive layer. The adhesion and barrier layers can be titanium (Ti), titanium tungsten (TiW), titanium nitride (TiN), tantalum (Ta), or tantalum nitride (TaN). The deposition of conductive layer 40 uses PVD, CVD, electrolytic plating, or electroless plating processes.

In FIG. 2b, a resistive layer 42 is patterned and deposited on conductive layer 40 and insulating layer 36. Resistive layer 42 has individual portions or sections 42a-42c. Resistive layer 42a is disposed over conductive layer 40a. Resistive layer 42b is disposed over insulating layer 36 between conductive layers 40b-40c. Resistive layer 42c surrounds conductive layer 40e. Resistive layer 42 is made with tantalum silicide (TaxSiy) or other metal silicides, TaN, nichrome (NiCr), TiN, or doped poly-silicon having a resistivity of about 5 to 100 ohm/sq. The deposition of resistive layer 42 may involve PVD or CVD with a thickness matching designed surface resistivity (Rs).

An insulating layer 44 is formed over and around resistive layer 42 using a patterning and deposition process. The insulating layer 44 has individual portions or sections 44a-44c. The insulating layer 44a is disposed over resistive layer 42a. The insulating layer 44b is disposed over resistive layer 42b. The insulating layer 44c is disposed over resistive layer 42c. The insulating layer 44 is made with SixNy, SiO2, SiON, Ta2O5, ZnO, ZrO2, Al2O3, or other material having dielectric insulation properties. The deposition of insulating layer 44 may involve PVD or CVD. Resistive layer 42 and insulating layer 44 are formed with the same mask and etched at the same time. Alternatively, resistive layer 42 and insulating layer 44 can be patterned and etched with a different mask. Resistive layer 42c and insulating layer 44c are used in part to support subsequent solder bumps and wire bonding.

A passivation layer 46 is formed over the structure described in FIGS. 2a-2b for structural support and physical and electrical isolation. Passivation layer 46 can be made with one or more layers of SixNy, Si3N4, SiN, SiO2, SiON, PI, BCB, PBO, epoxy-based polymers, or other insulating material. Portions of passivation layer 46 are removed by etching to expose insulating layer 44a and conductive layers 40a-40d, as shown in FIG. 2b.

In FIG. 2c, an electrically conductive layer 50 is patterned and deposited over insulating layer 44a, conductive layers 40a-40d through the openings in passivation layer 46. Conductive layer 50 is also patterned and deposited on insulating layer 36 and passivation layer 46. Conductive layer 50 can be made with Ti, TiN, Ta, TaN, TiW, Cr, Al, Cu, or other electrically conductive material. Conductive layer 50 may have an optional barrier layer. An electrically conductive layer 52 is patterned and deposited over conductive layer 50. Conductive layer 50 is an adhesive layer for conductive layer 52. Conductive layer 52 has individual portions or sections 52a-52d. The individual portions of conductive layers 52a-52d can be electrically common or electrically isolated depending on the connectivity of the individual semiconductor die formed on wafer 28. Conductive layer 52 can be made with one or more layers of Cu, Al, Au, or other electrically conductive material. In one embodiment, conductive layer 52 contains a seed layer and electroplated layer. More generally, the deposition of conductive layers 50 and 52 uses PVD, CVD, electrolytic plating, electroless plating, or lift-off process.

FIG. 2d shows an optional passivation layer 54 formed over the structure described in FIGS. 2a-2c for structural support and physical and electrical isolation. Passivation layer 54 can be made with one or more layers of SixNy, Si3N4, SiN, SiO2, SiON, PI, BCB, PBO, epoxy-based polymers, or other insulating material. In this embodiment, an adhesive layer 56, e.g., thermal-set or thermal plastic based polymer or inorganic adhesive, is applied over passivation layer 54 to bond to temporary wafer carrier 58 on a front side of wafer 28. The adhesive layer 56 can be activated and cured with ultraviolet (UV) light or heat with Tg>300° C. Carrier 58 is a wafer support structure for handling and support of the individual semiconductor die while removing sacrificial substrate 30. Carrier 58 can be glass, metal, silicon, wafer level molded molding compound or other suitable low-cost, rigid material. Carrier 58 has high resistivity with 1000-10000 ohm-cm.

In FIG. 2e, with the front-side wafer support structure in place, sacrificial substrate 30 is removed by a combination of backgrinding, silicon wet etching, plasma etching, or chemical mechanical polishing (CMP). That is, sacrificial substrate 30 is removed after forming the wafer support structure. The backgrinding can be performed with a mechanical grinder followed by wet etching. The silicon wet etchant can be, for example, 0.5-10% HF and 0.5-10% hydrogen peroxide (H2O2). After removing sacrificial substrate 30, the buffer layers 32-36 are patterned and etched to form vias 60 and 61 and expose conductive layers 52a and 40e, respectively. As examples of the backside interconnect structure, conductive layer 52a is a contact pad for a solder bump, and conductive layer 40e is a bond pad for a wire bond.

Figure 2F:
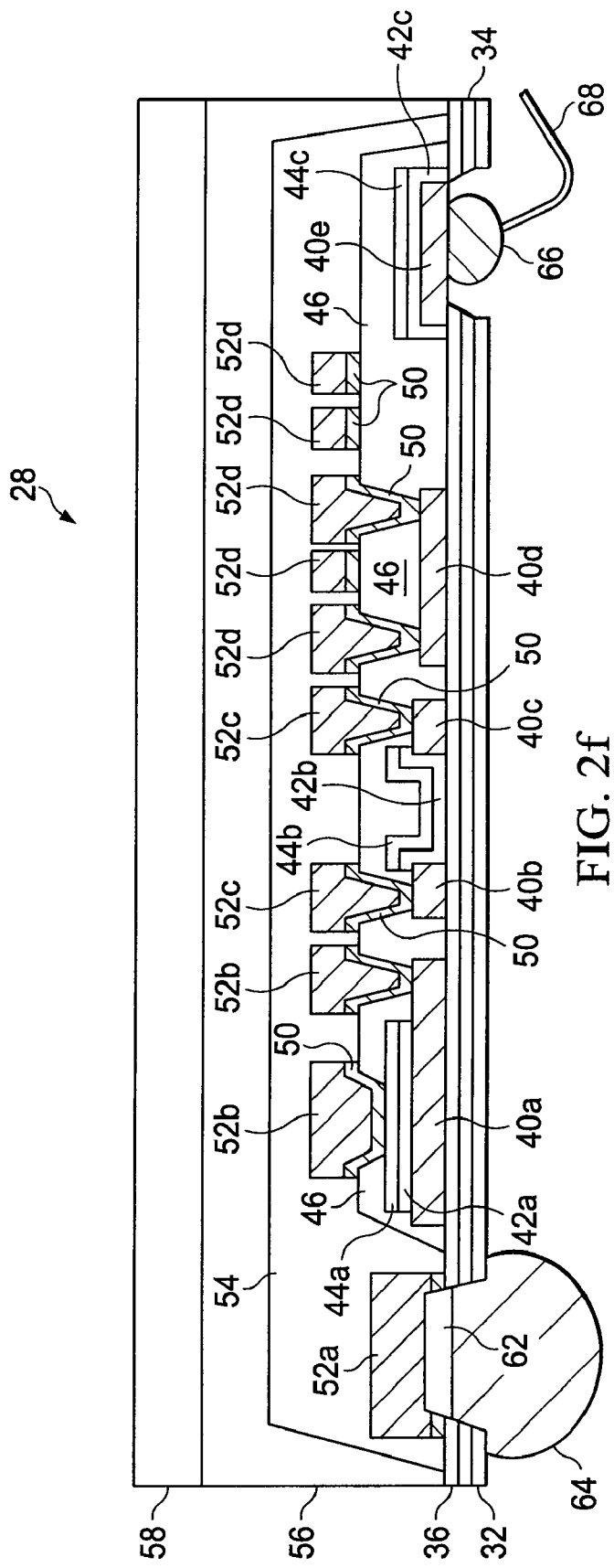

In FIG. 2f, a metal layer stack is deposited over conductive layer 52a using an evaporation, electrolytic plating, electroless plating, screen printing, or etch-back process to form optional under bump metallization (UBM) layer 62. UBM 62 can be made with Al, Ti, Ni, NiV, Cu, or Cu alloy. UBM 62 connects to conductor layers 40a-40e to provide the electrical interconnect for the semiconductor die. An electrically conductive solder material is deposited over UBM 62 through an evaporation, electrolytic plating, electroless plating, ball drop, or screen printing process. The solder material can be any metal or electrically conductive material, e.g., Sn, Ni, Au, Ag, lead (Pb), bismuthinite (Bi) and alloys thereof. The solder material is reflowed by heating the conductive material above its melting point to form spherical balls or bumps 64. In some applications, solder bumps 64 are reflowed a second time to improve electrical contact to UBM 62. A plurality of solder bumps like 64 is formed on the semiconductor device. As an alternative interconnect structure, FIG. 2f also shows wire bond 66 and bond wire 68 formed on conductive layer 40e.

The combination of conductive layer 40a-40d, resistive layers 42a-42c, and insulating layer 44a-44b constitute an integrated passive device (IPD). For example, conductive layer 40a, resistive layer 42a, insulating layer 44a, and conductive layer 50 is a metal-insulator-metal (MIM) capacitor. Resistive layer 42b is a resistor element in the passive circuit. The conductive layer 52d is an inductor. The conductive layer 52d is typically wound or coiled in plan-view, as shown by regions 52d in the cross-sectional view of FIG. 2f, to produce or exhibit the desired inductive properties. Conductive layer 40 is used as the bottom electrode of the MIM capacitor, electrode of the resistor, bridge of the inductor, and wire bonding pad. The passive circuit elements are electrically connected to one or more of the solder bumps like 64 through conductive layer 52. The above IPDs can perform one or more electrical functions such as a filter, balun, or diplexer. Other active and passive circuit elements can be formed on wafer 28 as part of the electrically functional semiconductor device.

Figure 3:
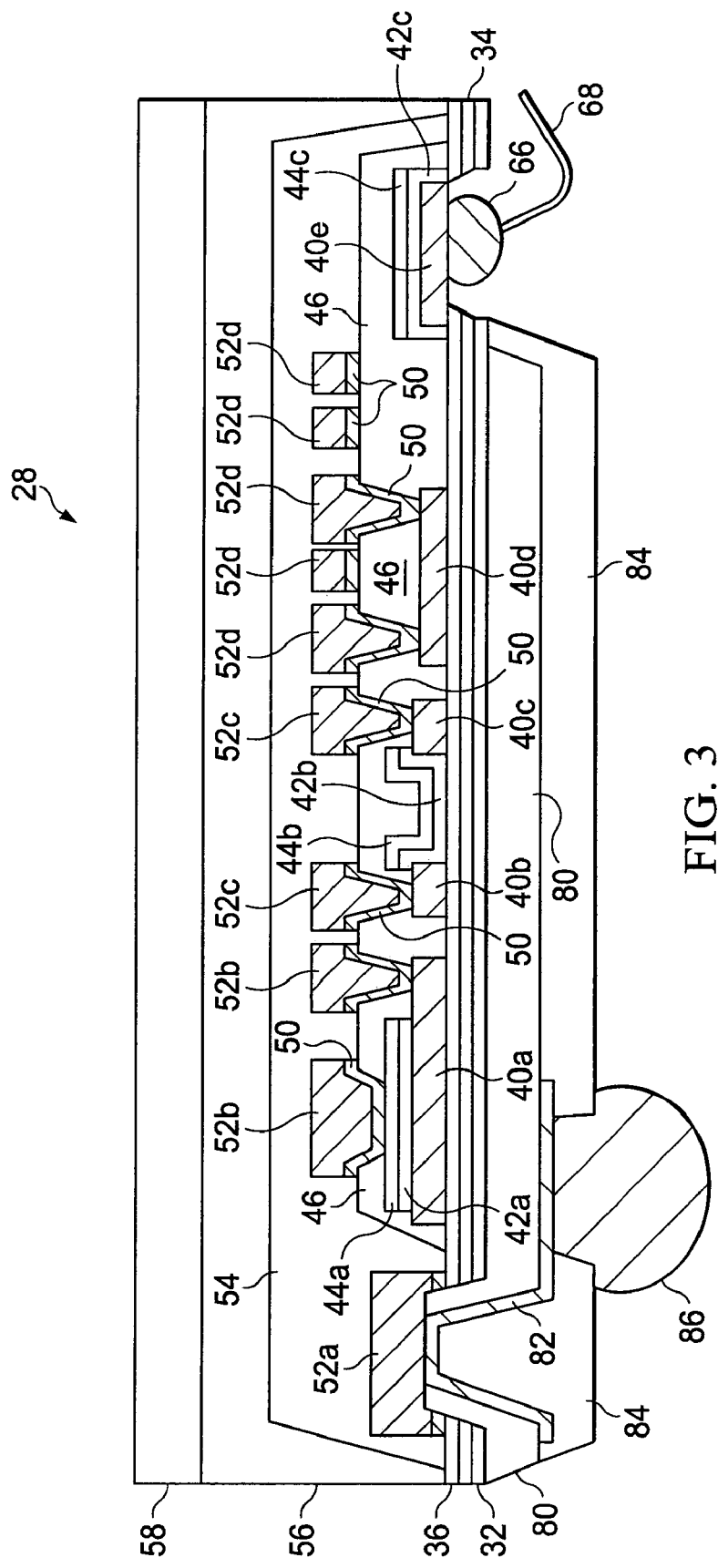
FIG. 3 illustrates the semiconductor device with integrated passive devices and backside interconnect structure with RDL.

FIG. 3 shows solder bumps re-routed toward a center area of the die to reduce die size. A passivation layer 80 is formed over via 60 and insulating layer 32 on the backside of the die for structural support and physical and electrical isolation. Passivation layer 80 can be made with one or more layers of SixNy, Si3N4, SiN, SiO2, SiON, PI, BCB, PBO, polymers, or other insulating material. A portion of passivation layer 80 is removed by etching to expose conductive layer 52a. A metalized redistribution layer (RDL) 82 is formed by depositing thin layers of metals over the surface of passivation layer 80. Multiple metal layers are typically required to meet the different functional requirements of the metalized RDL such as adhesion, barrier, conductor, and protection. Accordingly, RDLs 82 can be made with layers of Al, Ti, TiW, Cu, or Cu alloy. RDL 82 operates as an intermediate conduction layer to route electrical signals between conductive layer 52a and solder bump 86.

An insulating layer 84 is formed over passivation layer 80 and RDL 82 using a patterning and deposition process. The insulating layer 84 is made with SixNy, SiO2, SiON, Ta2O5, ZnO, ZrO2, Al2O3, or other material having dielectric insulation properties. The deposition of insulating layer 84 may involve PVD or CVD. A portion of insulating layer 84 is removed by etching to expose RDL 82. An electrically conductive solder material is deposited over RDL 82 through an evaporation, electrolytic plating, electroless plating, ball drop, or screen printing process. The solder material can be any metal or electrically conductive material, e.g., Sn, Ni, Au, Ag, Pb, Bi, and alloys thereof. For example, the solder material can be eutectic Sn/Pb, high lead, lead free, or other solder materials. The solder material is reflowed by heating the conductive material above its melting point to form spherical balls or bumps 86.

Figure 4:
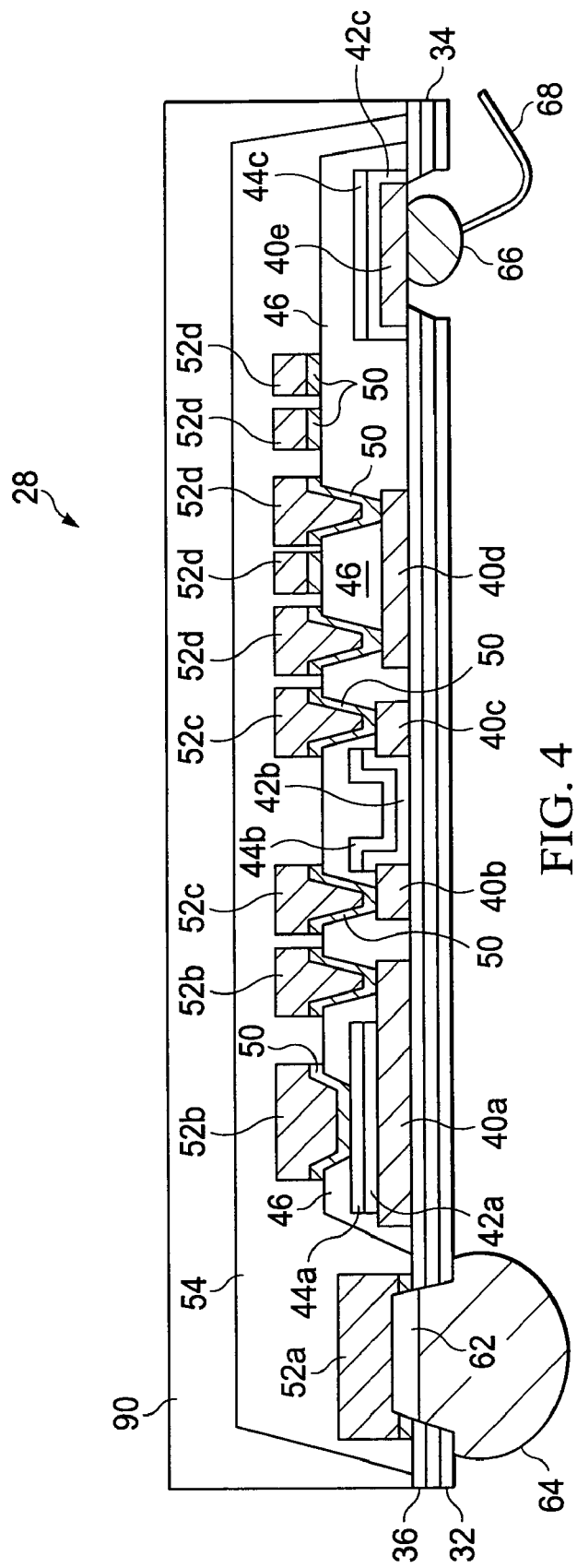
FIG. 4 illustrates the semiconductor device with integrated passive devices using molding compound to support the wafer while the sacrificial substrate is removed.

FIG. 4 illustrates the semiconductor die with molding compound 90 deposited over the structure from FIG. 2c. The molding compound 90 is non-conductive and environmentally protects the semiconductor device from external elements and contaminants. Molding compound 90 can be made with epoxy acrylate or other polymer material and applied by transfer molding, liquid encapsulant molding, or other molding process. The molding compound acts as a wafer support structure during backgrinding to remove sacrificial substrate 30. In this case, molding compound 90 remains in the final product. An interconnect structure is formed on the backside of the die, as shown in FIGS. 2f and 3.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a sacrificial substrate;
    forming a first insulating layer over the sacrificial substrate;
    forming a first passivation layer over the first insulating layer;
    forming a second insulating layer over the first passivation layer;
    forming an integrated passive device over the second insulating layer;
    forming a wafer support structure over the integrated passive device;
    removing the sacrificial substrate to expose the first insulating layer after forming the wafer support structure; and
    forming an interconnect structure over the first insulating layer in electrical contact with the integrated passive device.

2. The method of claim 1, wherein the integrated passive device includes an inductor, capacitor, or resistor.

3. The method of claim 1, wherein the interconnect structure includes a solder bump or wire bond.

4. The method of claim 3, wherein the interconnect structure includes an intermediate conduction layer formed on a backside of the semiconductor device to electrically connect the solder bump to the integrated passive device.

5. The method of claim 1, wherein the wafer support structure includes silicon, glass, ceramic, or molding compound.

6. The method of claim 1, further including removing the wafer support structure.

7. The method of claim 1, further including removing the sacrificial substrate by mechanical grinding and wet etching.

8. A method of making a semiconductor wafer, comprising:
    providing a sacrificial substrate;
    forming a buffer layer over the sacrificial substrate;
    forming an integrated passive device over the buffer layer;
    forming a wafer support structure over the integrated passive device;
    removing the sacrificial substrate to expose the buffer layer after forming the wafer support structure; and
    forming an interconnect structure over the buffer layer in electrical contact with the integrated passive device.

9. The method of claim 8, wherein the step of forming the buffer layer includes:
    forming a first insulating layer over the sacrificial substrate; and
    forming a first passivation layer over the first insulating layer.

10. The method of claim 9, wherein the step of forming the buffer layer further includes forming a second insulating layer over the first passivation layer.

11. The method of claim 8, wherein the integrated passive device includes an inductor, capacitor, or resistor.

12. The method of claim 8, wherein the interconnect structure includes a solder bump or wire bond.

13. The method of claim 12, wherein the interconnect structure includes an intermediate conduction layer formed on a backside of the semiconductor device to electrically connect the solder bump to the integrated passive device.

14. The method of claim 8, wherein the wafer support structure includes silicon, glass, ceramic, or molding compound.

15. The method of claim 8, further including removing the wafer support structure.

16. A method of making a semiconductor wafer, comprising:
    providing a sacrificial substrate;
    forming a buffer layer over the sacrificial substrate;
    forming a semiconductor device over the buffer layer;
    forming a wafer support structure over the semiconductor device;
    removing the sacrificial substrate to expose the buffer layer after forming the wafer support structure; and
    forming an interconnect structure over the buffer layer in electrical contact with the semiconductor device.

17. The method of claim 16, wherein the step of forming the buffer layer includes:
    forming a first insulating layer over the sacrificial substrate; and
    forming a first passivation layer over the first insulating layer.

18. The method of claim 17, wherein the step of forming the buffer layer further includes forming a second insulating layer over the first passivation layer.

19. The method of claim 16, wherein the semiconductor device includes an integrated passive device.

20. The method of claim 19, wherein the integrated passive device includes an inductor, capacitor, or resistor.

21. A semiconductor device made by a process, comprising:
    providing a sacrificial substrate;
    forming a buffer layer over the sacrificial substrate;
    forming an integrated passive device over the buffer layer;
    forming a wafer support structure over the integrated passive device;
    removing the sacrificial substrate to expose the buffer layer after forming the wafer support structure; and
    forming an interconnect structure over the buffer layer in electrical contact with the integrated passive device.

22. The semiconductor device of claim 21, wherein the buffer layer includes:
    a first insulating layer formed over the sacrificial substrate; and
    a first passivation layer formed over the first insulating layer.

23. The semiconductor device of claim 22, wherein the buffer layer further includes a second insulating layer formed over the first passivation layer.

24. The semiconductor device of claim 21, wherein the integrated passive device includes an inductor, capacitor, or resistor.

25. The semiconductor device of claim 21, wherein the interconnect structure includes a solder bump or wire bond.

* * * * *